United States Patent
Afghahi

(12)
(10) Patent No.: US 6,414,292 B1
(45) Date of Patent: Jul. 2, 2002

(54) IMAGE SENSOR WITH INCREASED PIXEL DENSITY

(75) Inventor: Morteza Afghahi, Mission Viejo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/429,891

(22) Filed: Oct. 29, 1999

(51) Int. Cl.[7] .................................................. H01J 40/14
(52) U.S. Cl. ..................................... 250/208.1; 348/308
(58) Field of Search .......................... 250/208.1, 214 A; 348/207, 308; 257/225, 291, 431

(56) References Cited

U.S. PATENT DOCUMENTS

| | | |
|---|---|---|
| 5,471,515 A | 11/1995 | Fossum et al. |
| 5,539,461 A * | 7/1996 | Andoh et al. ................ 348/308 |
| 5,541,402 A | 7/1996 | Ackland et al. |
| 5,614,744 A | 3/1997 | Merrill |
| 5,835,141 A | 11/1998 | Ackland et al. |
| 5,841,126 A | 11/1998 | Fossum et al. |
| 5,841,176 A | 11/1998 | Merrill |
| 5,844,598 A | 12/1998 | Janesick |
| 5,847,422 A | 12/1998 | Chi et al. |
| 5,854,100 A | 12/1998 | Chi |
| 6,118,482 A * | 9/2000 | Clark et al. .................. 348/308 |
| 6,133,563 A * | 10/2000 | Clark et al. ............... 250/208.1 |
| 6,243,134 B1 * | 6/2001 | Beiley .......................... 348/308 |

* cited by examiner

Primary Examiner—Seungsook Ham
Assistant Examiner—Seung C. Sohn
(74) Attorney, Agent, or Firm—Blakely, Sokoloff, Taylor & Zafman LLP

(57) ABSTRACT

An image sensor is disclosed that provides improved image resolution, for a given integrated circuit die size, by eliminating one or more dedicated power supply lines that feed each sensor element of the sensor array, thereby allowing greater sensor element density. Each sensor element has a first switch that is coupled to a photodetector to alternatively, under the control of a reset signal, (1) provide a first current to reset the photodetector and (2) present high impedance to the photodetector. A reset line is coupled to the first switch in each of the sensor elements to provide the reset signal and to both control the first switch and supply the first current. Such an image sensor may be particularly desirable when built using a metal oxide semiconductor (MOS) fabrication process. The image sensor may be used in a variety of imaging systems, including digital cameras.

18 Claims, 5 Drawing Sheets

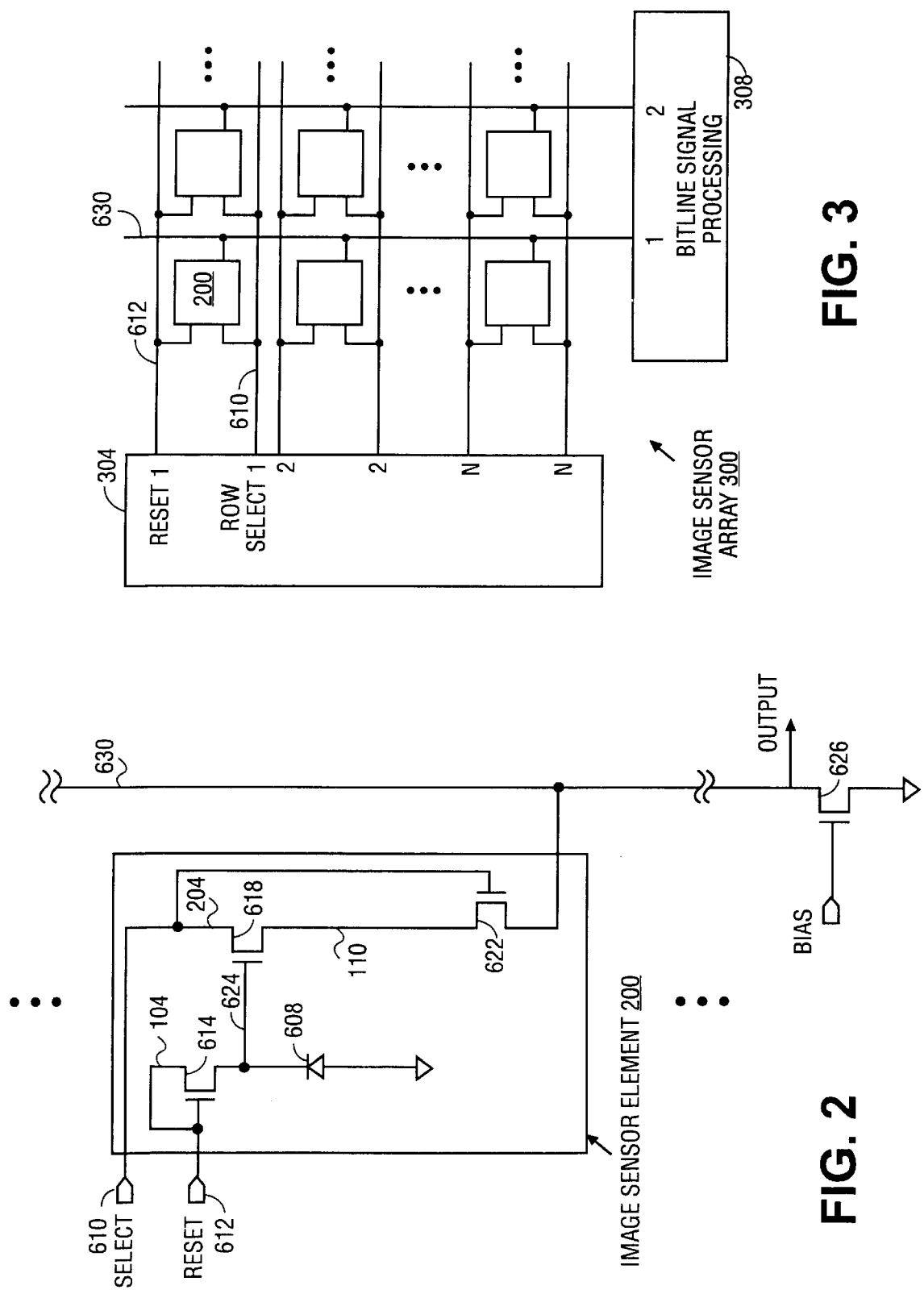

IMAGE SENSOR WITH INCREASED PIXEL DENSITY

FIELD OF THE INVENTION

This invention is generally related to image sensor integrated circuits and particularly those built using metal oxide semiconductor (MOS) fabrication processes.

BACKGROUND

Image sensor integrated circuits (ICs) are used in a wide variety of solid state electronic imaging systems. Many of these systems, including for instance still-shot cameras, also known as digital cameras, and certain video cameras, are equipped with MOS image sensor ICs rather than the more conventional charge coupled device (CCD) variety. An image sensor, whether it be a MOS or CCD variety, typically contains thousands of sensor elements sometimes known as picture element (pixel) circuits arranged in a flat, two-dimensional array. These sensor elements together form a photosensitive region that lies at the focal point of the camera and electrically captures an image that has been formed on the region. Cameras that use MOS image sensors have proven to be relatively inexpensive to manufacture as compared to those that have the CCD variety, and MOS-based cameras are expected to gain market share over their CCD rivals.

A problem with conventional MOS image sensors is that the relatively large size of a MOS image sensor element precludes the capture of images having high resolution, which has hampered their entry into certain markets that demand detailed images from the camera. FIG. 6 shows the equivalent circuit schematic of a conventional MOS image sensor element 604. The element 604 is typically connected to an output line 630 (also known as a bitline) to which a number of other identical sensor elements are also connected to form a column of an array (not shown). A bias transistor 626 is typically coupled to the bitline 630 as a load to each of the sensor elements. The array will include several thousand of such columns.

The conventional element 604 has a photodiode 608 which can be reset by asserting a control signal on a reset control line 612. The reset control line is typically coupled to several sensor elements, e.g., such as a row of elements in the array, so as to simultaneously prepare all of these elements to detect the incident energy. A reset transistor 614 receives the control signal at its gate and provides current from a main supply rail 616, having a potential Vdd, to reverse bias the photodiode to a reset voltage. A photodiode signal is amplified by a source follower 618 whose current is supplied by a pixel supply rail 620 at a potential VccPx, which is typically separate from the supply rail 616. The main and pixel supply rails typically extend across the sensor array and connect to each sensor element in the array.

The incident energy, typically visible light, is detected for the entire array during a single time interval known as the exposure or integration interval in which a photodiode signal is generated. The integration interval begins when reset is deasserted, and the photodiode is presented a high impedance by the reset transistor. This allows the photodiode voltage to decay in proportion to the incident energy and instantaneously yield a photodiode signal voltage. While a select signal is asserted on the select control line 610, the signal voltage is sampled at the end of the integration interval. The difference between the signal voltage and the reset voltage is a measure of the detected incident energy during the integration interval.

In view of the foregoing, it would be desirable to increase the image resolution of such a sensor array, without increasing the size of the integrated circuit die on which the sensor array is formed, and without adversely impacting sensor performance.

SUMMARY

In accordance with an embodiment of the invention, an image sensor is disclosed. The sensor has a number of sensor elements, where each element has a first switch coupled to a photodetector to alternatively, under the control of a reset signal, (1) provide a first current to reset the photodetector, and (2) present a high impedance to the photodetector. A reset line is coupled to the first switch in each of the sensor elements to provide the reset signal, and to both control the first switch and supply the first current.

Other features and advantages of the invention will be apparent from the accompanying drawings and from the detailed description that follows below.

BRIEF DESCRIPTION OF THE DRAWINGS

The invention is illustrated by way of example and not by way of limitation in the figures of the accompanying drawings in which like references indicate similar elements and in which:

FIG. 2 shows an image sensor element configured according to another embodiment of the invention.

FIG. 3 shows an image sensor array that features sensor elements according to various embodiments of the invention.

DETAILED DESCRIPTION

The various embodiments of the invention may increase the resolution of an image sensor, without increasing the area of an integrated circuit die that contains a sensor array, by allowing the sensor elements to be more tightly packed as a result of eliminating one or more of the supply rails that are conventionally used to power the sensor elements. The power that was conventionally supplied to each sensor element through dedicated supply lines can now be provided through the reset lines, and, optionally, through the select lines, which reach all sensor elements in the array. Eliminating the supply rails is expected to allow sensor elements to be positioned closer to each other, thereby increasing the density of sensor elements in the array to yield increased image resolution. This is expected to be accomplished without a significant increase in the size of the reset and select lines, due to the now "distributed" nature of the power delivery to the sensor elements. Thus, the basic layout of the conventional sensor element may remain unchanged, which avoids an increase in the manufacturing cost of the image sensor. The greater drive capability imposed on the reset and the select signals can be easily supported by modified control signal generation circuitry that is typically separate from the sensor array itself. It should be noted that references to "an" embodiment in this disclosure are not necessarily to the same embodiment, and they mean at least one.

Additional benefits that may be obtained by eliminating the power supply interconnection lines according to certain embodiments of the invention include greater improvements in pixel density with future process technologies that yield smaller reductions in the size of interconnection lines than in feature size; reduced shadowing of photosensitive regions below the interconnection lines (hence greater sensitivity); and increased field of view to each photosensitive region.

Figure 1:
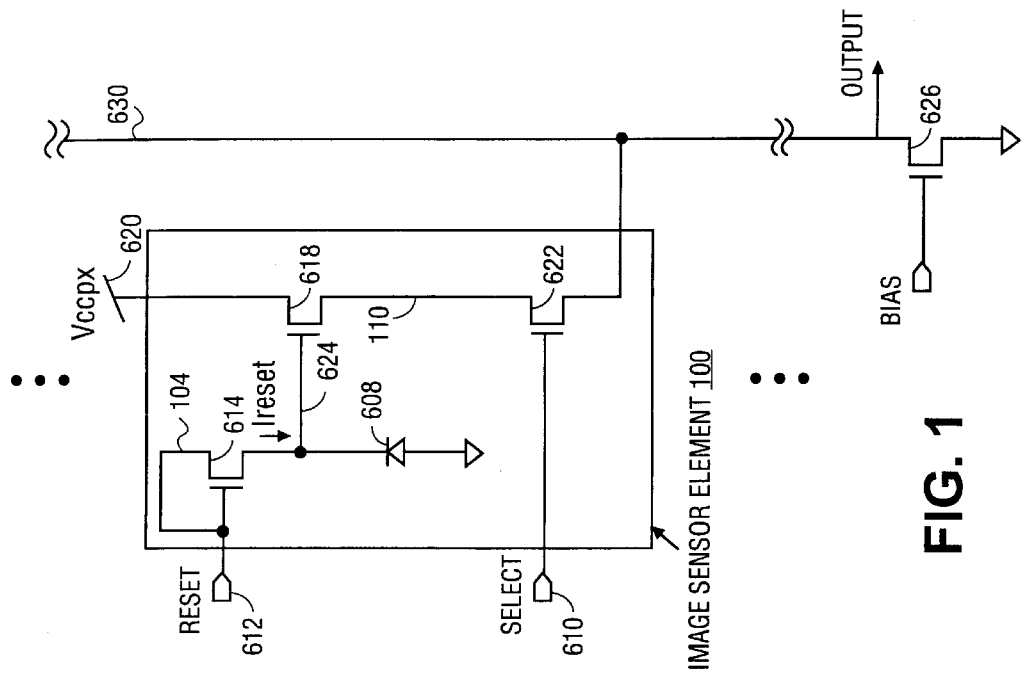
FIG. 1 shows a schematic of an image sensor element that is part of an image sensor configured to an embodiment of the invention.
Figure 6:
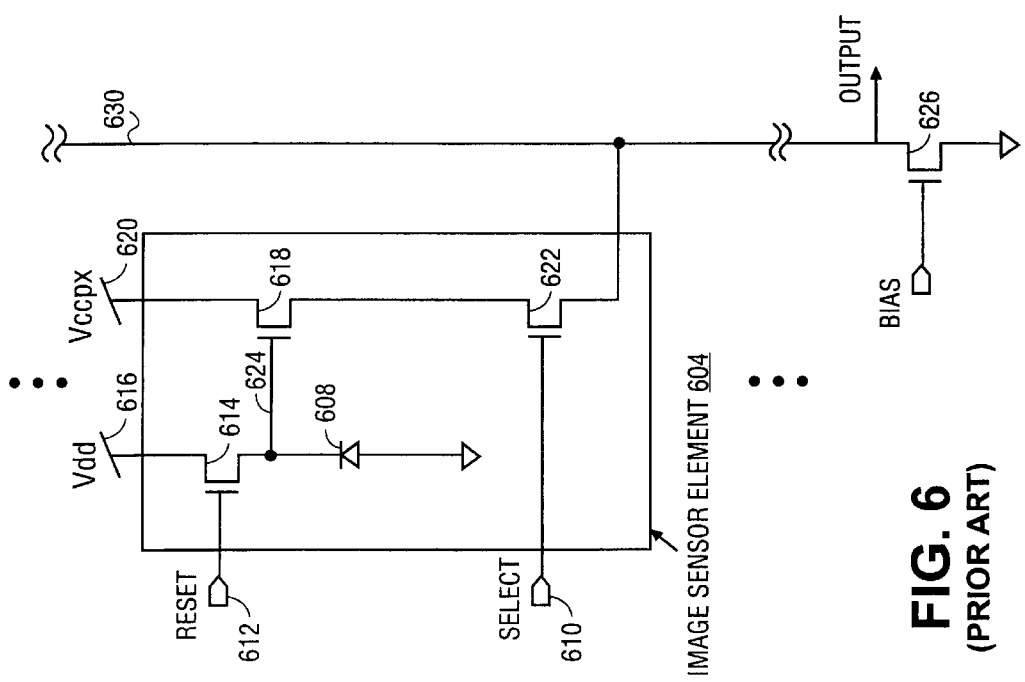
FIG. 6 shows the circuit schematic of a conventional MOS sensor element.

FIG. 1 shows the equivalent circuit schematic of an image sensor element 100 according to an embodiment of the invention. The sensor element 100 has a first switch 614, represented in this version by an n-channel MOS field effect transistor (FET), that is coupled to a photodetector 608. The switch, under the control of a reset signal received on the reset control line 612, alternatively provides a first current to reset the photodetector 608, and presents a high impedance to the photodetector. The single reset line 612 is used to both control the first switch 614 and supply the first current. This is in contrast to the conventional sensor element 604 (see FIG. 6 momentarily) in which a main supply rail 616 is used to provide the first current separate from the reset line. The image sensor element 100 may otherwise be essentially identical to the conventional element 604, including an amplifier 618 such as the source follower shown, a coupling 624 which connects the source follower to the photodetector 608, as well as a second switch 622, represented here as an n-channel MOSFET, under the control of select signal received on the select line 610.

The second switch 622 and the amplifier 618 are part of a transfer gate that is coupled between the photodetector 608 and the output line 630. The transfer gate receives the select line 610 which controls the transfer of a photodetector output (reset voltage or signal voltage) to the output line 630. In the schematic of FIG. 1, the transfer gate of image sensor element 100 comprises the coupling 624 between the photodetector 608 and the amplifier 618, the amplifier 618, and a coupling 110 between an output of the amplifier 618 and the second switch 622. The amplifier 618 is powered through a supply line 620, having potential VccPx. The second switch 622 is coupled to be controlled through the select line 610. An input of the amplifier 618 is coupled to an output of the photodetector 608. An output of the amplifier 618, in this case the source terminal of a source follower, is coupled to the output line 630 through the second switch 622. In operation, the photodetector output voltage is buffered by the source follower and provided to the output line 630, with a reduction in the amount of the threshold voltage of the source follower. This occurs only when the second switch 622 conducts in response to the select signal being asserted. An overall timing for the reset and select signals that are used to define an integration interval and then provide the photodetector output for readout in an image sensor array will be discussed below in connection with FIG. 4.

There may be several alternatives to the sensor element 100 shown in FIG. 1 that may be equally desirable, depending upon the imaging system. For instance, the photodetector 608 can be a conventional photodiode which is depicted in FIG. 1, but may alternatively be another type of photodetecting device, one which uses the first current to reset itself in preparation for detecting incident energy and that also can benefit from the high impedance provided by the first switch 614 during an integration or light detection interval. With a photodiode, the additional drive capability of the reset signal demanded by the invention is manageable because it is of a pulse nature.

The first switch 614 as indicated above can be an n-channel FET to provide the first current as well as present the high impedance in response to the reset signal received at its gate. In the particular version of FIG. 1, this FET has its gate and drain electrically connected using a coupling 104 which, once again for this particular version only, is shown as a conducting line. This is known as a diode-connected FET. An alternative here for the coupling 104 might be a resistive device between the gate and drain. In general, there may be a wide range of alternatives for the first switch 614 other than a diode-connected n-channel FET.

Figure 7:
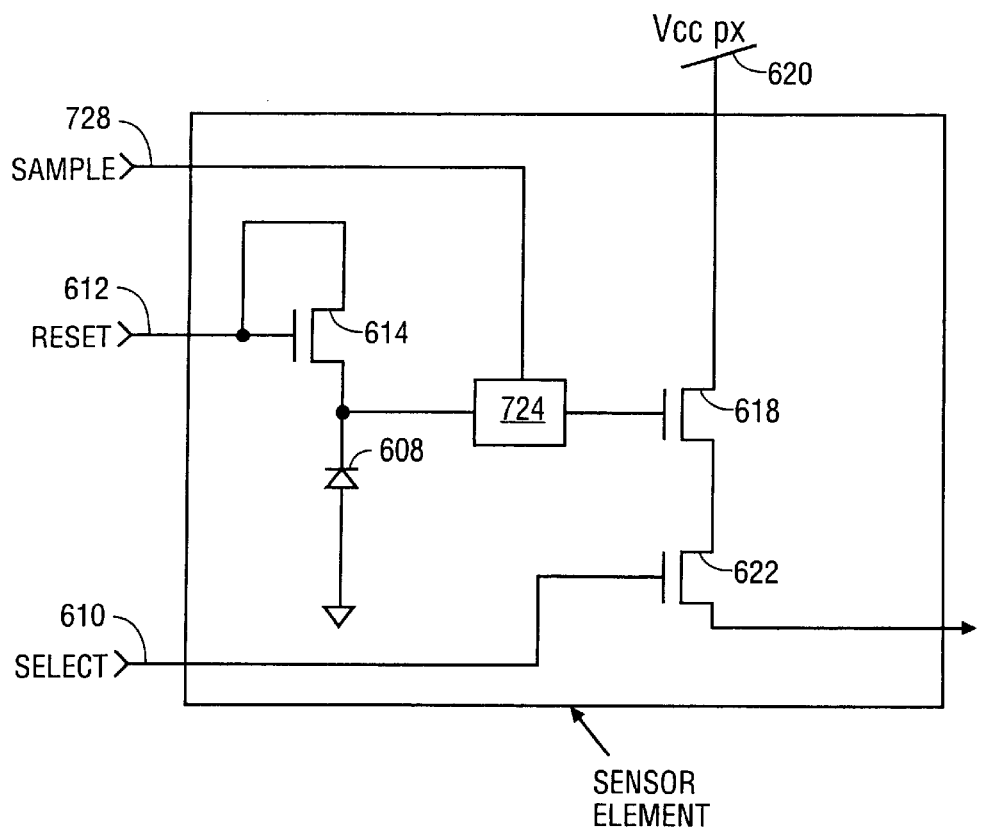
FIG. 7 illustrates a circuit schematic of an image sensor element according to another embodiment of the invention.

Although a source follower is shown for the amplifier 618, amplifiers other than source followers may alternatively be used here. In addition, as discussed in the previous paragraph, the input of the amplifier 618 inside the transfer gate of the sensor element 100 may be shorted to the output of the photodetector 608, such that the coupling 624 is merely a conducting line. As an alternative which is shown in FIG. 7, the coupling 624 may be replaced by a third switch 724 that is to be controlled through a separate sample line 728. In this alternate version, the third switch 724, being coupled between the input of the amplifier 618 and the output of the photodetector 608, serves to isolate the photodetector output voltage at the input of the amplifier 618. This is done following the end of the integration interval at which time a sample signal is asserted to capture the photodetector signal voltage. Thus, in this version, in addition to the reset line 612 and the select line 610, a sample line 728 is also connected to each sensor element, and more particularly to the transfer gate therein, to control the third switch 724. Such an alternative is sometimes used to help obtain a more accurate representation of the incident energy during the integration interval, particularly when the sensor array is relatively large. This comes at the expense of a slightly larger sensor element, which reduces the density of the sensor array and thereby reduces the image resolution for a fixed die size.

FIG. 2 shows the equivalent circuit schematic of another embodiment of the invention as sensor element 200. In this version of the invention, the supply rail 620 (see FIG. 6 momentarily) to each sensor element is eliminated by powering the amplifier 618 in the transfer gate through the select line 610 and a coupling 204. The select line 610 is also used to control the second switch 622 to transfer the photodetector output onto the output line 630. An additional embodiment as a variation to the sensor element 200 is the provision of a third switch for the coupling 624, between the photodetector 608 and the amplifier 618, similar to the version that was discussed above in connection with FIG. 1.

Having described various embodiments of the invention as sensor elements in which the connections to the supply rails have been eliminated, FIG. 3 illustrates an exemplary image sensor array 300 which features a number of tightly packed sensor elements 200. The elements of the array are arranged in columns and rows, where for this particular version, each column of elements is connected to a respective output line 630, also known as a bitline. For this particular version, each row of sensor elements is connected to a common select line 610 and a common reset line 612. The reset and select lines are driven by control signal generation circuitry 304 that provides the enhanced current driving capability for the reset and select signals. The circuitry 304 generates the signals according to a proper timing that allows for sequentially sampling the photodetector outputs in a row by row manner. The photodetector reset and signal voltages on the output lines 630 are processed by bitline signal processing circuitry 308 that may include noise cancellation and analog-to-digital (A/D) conversion in preparation for digital image processing.

Figure 4:
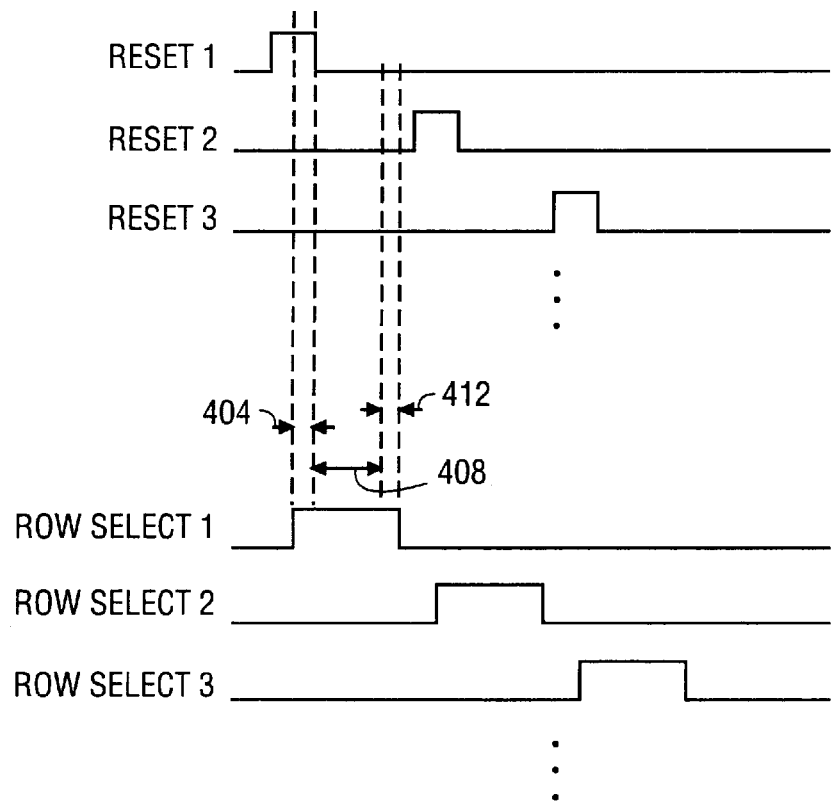
FIG. 4 depicts a timing diagram of reset and select signals that can be applied to an image sensor array that is configured according to an embodiment of the invention.

FIG. 4 illustrates an exemplary timing diagram of reset and select signals that may be applied to the sensor array 300 shown in FIG. 3. In this particular version, each of the reset and select signals are shown as two level digital signals. The low level in each signal allows the first and second switches to be turned off. The high levels turn the switches on and provide the current needed to reset the photodetector and power the amplifier, respectively. The following description will refer to the sensor element 200 in FIG. 2 and will focus only on the Reset1 and RkowSelect1 pulse signals in FIG. 4. It is evident that the same sequence also applies to Reset2/RowSelect2 and so on throughout the sensor array.

When the Reset 1 pulse is asserted, the first switch 614 conducts and supplies the first current to the photodetector 608. The RowSelect1 pulse should be timed so that upon being asserted, the photodetector has already been reset, i.e., its reset voltage appears at the coupling 624. The reset voltage, minus a threshold drop of the source follower, may now be sampled during the interval 404 at the output line 630. After the interval 404, the Reset1 pulse is deasserted, thereby turning off the first switch 614 and supplying a high impedance to the photodetector 608. This ends the so-called reset interval, and marks the start of an integration interval 408 during which the photodetector actually detects the incident energy as a readable signal voltage. During the integration interval 408, the signal voltage is amplified by the amplifier 618 and is provided, through the second switch 622, at the respective output line 630 because the Row Select1 pulse is asserted. The signal voltage can be read during a read interval 412 that marks the end of the integration interval. Once all voltage signals in a given row of the sensor array have been sampled from the output lines, the select signal for that row is deasserted. Thereafter, the system will proceed to sample another row, for instance the next row in the sequence, and asserts the reset signal and the select signal for the new row. The above procedure may be repeated for all other rows to sample the entire sensor array. The sampled signals of the sensor array may then be processed and then converted into digital form according to conventional signal and image processing techniques. Although this example shows each row of sensor elements as having a separate reset line, it is evident that the invention is not limited to such a configuration. For instance, several rows may be controlled by the same reset line.

Figure 5:
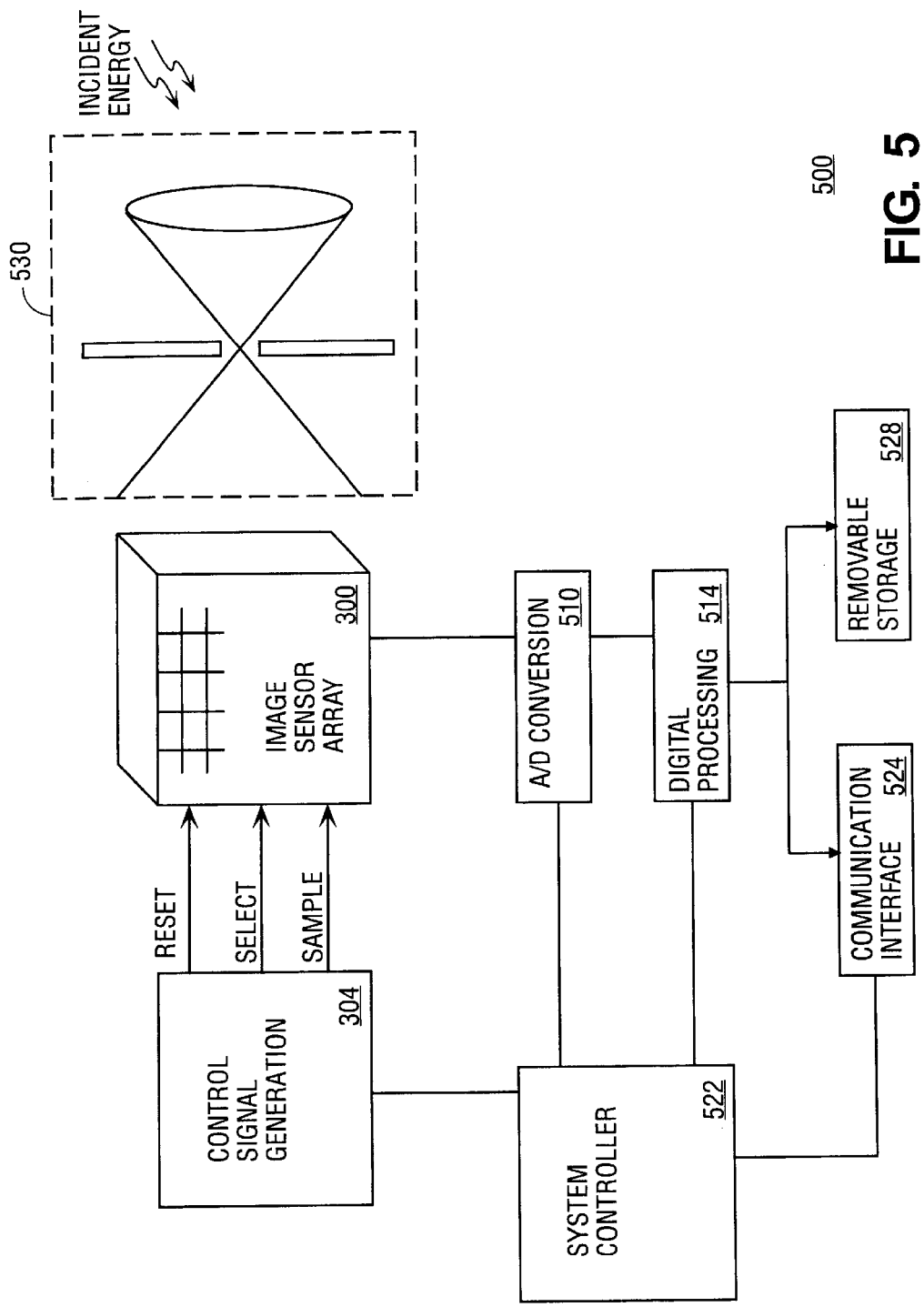
FIG. 5 shows a block diagram of an imaging system that can be configured according to an embodiment of the invention.

FIG. 5 illustrates an imaging system 500 that can be configured with an image sensor array 300 that contains sensor elements of the types described earlier. The image sensor array 300 may lie at the focal point of a conventional optical system 530 that brings the incident energy to the image sensor array 300 as, for instance, an optical image. The optical system 530 may include conventional components such as an adjustable aperture, optical filter, and focusing lens elements.

The reset and select signals, and, optionally, the sample signals, are provided by conventional control signal generation circuitry 304, with the appropriate timing, so that all sensor elements in the array 300 can be properly read to form a detected, "digital image." The photodetector reset and signal voltages are converted into digital form by a conventional A/D conversion unit 510, and then processed, according to known image and signal processing techniques, by digital processing block 514. The digital processing may include, for instance, color correction functions, scaling, and perhaps compression, to yield a digital image file.

Once the digital image file has been created, it may be communicated to an image processing and/or viewing system, such as a stand-alone personal computer or a printer, via a communication interface 524. As an alternative, the digital image may be placed in a removable storage device 528, such as a flash memory card, for subsequent transfer to image processing and viewing equipment. The overall operation of the components in the system 500 may be orchestrated by a system controller 522 that may feature a microcontroller or a processor that is executing firmware. There are, of course, a wide range of alternatives for the system controller, including for instance the use of a sophisticated state machine rather than a programmed processor. The system controller 522 may also respond to configuration commands received from outside of the system 500 via the communication interface 524. For instance, the system 500 may be a digital camera that is tethered to a personal computer and is essentially controlled by software running on the personal computer.

To summarize, various embodiments of the invention as an image sensor with increased pixel density have been described. The image sensor array achieves its relatively high density by eliminating one or more power supply rails that are used in conventional sensor arrays to power the individual sensor elements. The power required by the photodetecting circuitry and the transfer gate in each sensor element is provided through the conventional reset and select lines.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An image sensor comprising:
    a plurality of sensor elements each having a first switch coupled to a photodetector to alternatively, under the control of a reset signal, (1) provide a first current to reset the photodetector and (2) present a high impedance to the photodetector;
    a reset line coupled to the first switch in each of the sensor elements to provide the reset signal and to both control the first switch and supply the first current;
    a plurality of output lines;
    a transfer gate in each sensor element coupled between the photodetector and a respective one of the output lines; and
    a select line coupled to the transfer gate in each sensor element to control the transfer of a photodetector output signal to the respective one of the output lines, wherein the transfer gate includes amplifier being powered through the select line, the amplifier having an input being coupled to an output of the photodetector, and a second switch coupled to be controlled through the select line, an output of the amplifier being coupled to the respective one of the output lines through the second switch.

2. The image sensor of claim 1 wherein the photodetector includes a photodiode.

3. The image sensor of claim 2 wherein the first switch includes a FET to both provide the first current and present the high impedance, a gate and drain of the FET being coupled to the reset line.

4. The image sensor of claim 3 wherein the FET is a n-channel device being diode-connected with the gate and drain shorted.

5. The image sensor of claim 1 wherein in each sensor element, the input of the amplifier is shorted to the output of the photodetector.

6. The image sensor of claim 1 further comprising sample line coupled to the transfer gate in each sensor element, and in the transfer gate of each sensor element, a third switch coupled to be controlled through the sample line, the third switch being coupled between the input of the amplifier and the output of the photodetector to isolate the photodetector output at the input of the amplifier.

7. The image sensor of claim 1 wherein in the transfer gate of each sensor element the amplifier is a MOS amplifier.

8. An image sensor comprising:

means for responding electrically to light;

means for both resetting the responding means and allowing the responding means to respond electrically to light, without requiring a dedicated power supply line to be coupled to the responding means; and means for transferring a photodetector output signal from each of said responding means to a plurality of output lines, without requiring a dedicated power supply line to power the transferring means.

9. An imaging system comprising:

image sensor having a plurality of sensor elements, the elements to provide photodetector outputs in response to incident light and according to control signals, each element having a first switch coupled to a photodetector to alternatively, under the control of a reset signal, (1) provide a first current to reset the photodetector and (2) present a high impedance to the photodetector, reset line coupled to the first switch in each of the sensor elements to provide the reset signal and to both control the first switch and supply the first current, plurality of output lines, transfer gate in each sensor element coupled between the photodetector and a respective one of the output lines, and select line coupled to the transfer gate in each sensor element to control the transfer of a photodetector output signal to the respective one of the output lines, wherein the transfer gate includes amplifier being powered through the select line, the amplifier having an input being coupled to an output of the photodetector, and second switch coupled to be controlled through the select line, an output of the amplifier being coupled to the respective one of the output lines through the second switch;

control circuitry configured to generate the control signals, including the reset signal, for controlling the image sensor;

analog-digital conversion unit to digitize the photodetector outputs; and communication interface to transfer the digitized outputs to a stand-alone image processing and display system separate from the imaging system.

10. The imaging system of claim 9 further comprising:

optical system configured to guide incident light to form an image on the image sensor, the optical system having an adjustable focusing lens.

11. The imaging system of claim 9 further comprising:

system controller to control operation of the control circuitry and the analog-to-digital conversion unit to automate the creation of digital image files.

12. The imaging system of claim 9 wherein the photodetector in each sensor element includes a photodiode.

13. The imaging system of claim 12 wherein the first switch in each sensor element includes a MOSFET to both provide the first current and present the high impedance.

14. The imaging system of claim 9 wherein the image sensor and the control circuitry are built on the same IC die using a MOS fabrication process.

15. A method comprising:

using a reset line to alternatively (1) provide a plurality of currents sufficient to reset a plurality of photodetectors in an image sensor, respectively, and (2) using said reset line to control a plurality of first switches to cutoff the plurality of currents, respectively; and using a select line to (1) provide a plurality of currents that power a plurality of amplifiers, respectively, wherein each amplifier has an input coupled to an output of a respective one of a plurality of photodetectors, and (2) using a said select line to control a plurality of second switches that couple outputs of the plurality of amplifiers to a plurality of output lines, respectively.

16. The method of claim 15 further comprising:

using a sample line to control a plurality of third switches, each being coupled between the input of a respective amplifier and the output of a respective photodetector to isolate the photodetector output from the input of the amplifier.

17. The method of claim 15 further comprising:

digitizing a plurality of pixel signals available on the plurality of output lines; and transferring a plurality of digitized pixel signals to a stand-alone image processing and display system.

18. The method of claim 17 further comprising:

prior to using the reset and select lines, focusing an image on the image sensor using an optical system.

* * * * *